US008243469B2

(12) United States Patent
Jaze et al.

(10) Patent No.: US 8,243,469 B2
(45) Date of Patent: Aug. 14, 2012

(54) FERRITE INDUCTORS INTEGRATED WITHIN INPUT/OUTPUT CABLE PORT ASSEMBLY OF AN ELECTRONICS RACK

(75) Inventors: Alma Jaze, Astoria, NY (US); Alan H. Knight, Cary, NC (US); John M. Skillman, New Paltz, NY (US); Kwok M. Soohoo, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 251 days.

(21) Appl. No.: 12/750,736

(22) Filed: Mar. 31, 2010

(65) Prior Publication Data

US 2011/0242787 A1 Oct. 6, 2011

(51) Int. Cl.
*H05K 9/00* (2006.01)
(52) U.S. Cl. ........ 361/818; 361/800; 361/816; 361/826; 174/32; 174/350
(58) Field of Classification Search .................. 361/800, 361/816, 818; 174/32, 350, 377; 439/607.15, 439/44, 49
See application file for complete search history.

(56) References Cited

U.S. PATENT DOCUMENTS

| | | | |
|---|---|---|---|
| 3,744,001 A * | 7/1973 | Schor | 439/607.01 |
| 4,764,422 A | 8/1988 | Hill et al. | |
| 4,992,060 A * | 2/1991 | Meyer | 439/620.21 |
| 5,708,568 A | 1/1998 | Ostendorf | |
| 5,770,984 A | 6/1998 | Raleigh et al. | |
| 6,058,025 A | 5/2000 | Ecker et al. | |
| 6,142,829 A | 11/2000 | O'Groske et al. | |
| 6,147,299 A | 11/2000 | Ferguson | |
| 6,147,928 A * | 11/2000 | Onizuka et al. | 367/43 |
| 6,157,547 A | 12/2000 | Brown et al. | |

(Continued)

FOREIGN PATENT DOCUMENTS

GB 2251733 A 7/1992

(Continued)

OTHER PUBLICATIONS

Urabe et al., "A Method for Measuring the Characteristics of an EMI Suppression Ferrite Core", IEEE Transactions on Electromagnetic Compatibility, vol. 48, No. 4, pp. 774-780 (Nov. 2006).

(Continued)

*Primary Examiner* — Dameon Levi
(74) *Attorney, Agent, or Firm* — Dennis Jung, Esq.; Kevin P. Radigan, Esq.; Heslin Rothenberg Farle & Mesiti P.C.

(57) ABSTRACT

An input/output cable port assembly and electromagnetic interference (EMI) attenuation method are provided. The port assembly includes a cable port structure for an electronics rack with an opening for input/output cables to pass therethrough, and a first and a second partition. The first and second partitions couple to the cable port structure and reside within the opening. The first partition includes at least one ferrite inductor portion and the second partition includes at least one second ferrite inductor portion. The partitions are configured to be disposed adjacent to each other as adjoining partitions within the cable port structure, and when disposed as adjoining partitions, the first and second ferrite inductor portions mate and define a ferrite inductor with a central opening for input/output cable(s) of the electronics rack to pass. The ferrite inductor attenuates electromagnetic interference resulting from transient or steady state currents on the cable(s) passing therethrough.

19 Claims, 7 Drawing Sheets

U.S. PATENT DOCUMENTS

| | | | |
|---|---|---|---|
| 6,249,205 B1 | 6/2001 | Meadors et al. | |
| 6,268,787 B1 * | 7/2001 | Onizuka | 336/92 |
| 6,346,673 B1 * | 2/2002 | Onizuka | 174/36 |
| 6,469,244 B1 | 10/2002 | Harrison et al. | |
| 6,477,061 B1 | 11/2002 | Johnson | |
| 6,641,439 B2 | 11/2003 | Kim | |
| 6,667,436 B2 | 12/2003 | Takami et al. | |
| 6,885,258 B2 * | 4/2005 | Suzuki | 333/12 |
| 6,953,889 B2 | 10/2005 | Hanks | |
| 7,140,923 B2 * | 11/2006 | Karir et al. | 439/676 |
| 2006/0034026 A1 * | 2/2006 | Chiku et al. | 361/85 |
| 2007/0013470 A1 | 1/2007 | Berens et al. | |
| 2007/0190815 A1 * | 8/2007 | Sampson et al. | 439/49 |
| 2011/0242788 A1 | 10/2011 | Jaze et al. | |

FOREIGN PATENT DOCUMENTS

| | | |
|---|---|---|
| JP | 05-325690 | 12/1993 |
| JP | 05-325691 | 12/1993 |
| JP | 07-170631 | 7/1995 |
| JP | 11-260645 | 9/1999 |
| JP | 11-346085 | 12/1999 |
| JP | 2000-348826 | 12/2000 |
| JP | 2002-111256 | 4/2002 |
| JP | 2003-249778 | 9/2003 |

OTHER PUBLICATIONS

Fujiwara et al., "An Analysis of Load Effects Produced by Ferrite Core Attachment", Electronics and Communications in Japan, Part 1, vol. 80, No. 9, pp. 19-24 (1997).

Masahi et al., "Suppression Effect of Radiated Emission from Twisted Pair Wires with Ferrite Core", IEEE International Symposium on Electromagnetic Compatibility, Boston, MA, pp. 448-453 (Aug. 18, 2003-Aug. 22, 2003).

Bahri et al., "Serpent Assembly with Ferrite Core", www.ip.com, IPCOM000103295D, Sep. 1, 1990.

Anonymous, "A New EMI Shield Design to Minimize Connector/Cable EMI Emissions", www.ip.com, IPCOM000143944D, Dec. 12, 2006.

A. Jaze et al., Office Action for U.S. Appl. No. 12/750,740, filed Mar. 31, 2010 (U.S. Patent Publication No. 2011/0242788 Al), dated Feb. 2, 2012.

* cited by examiner

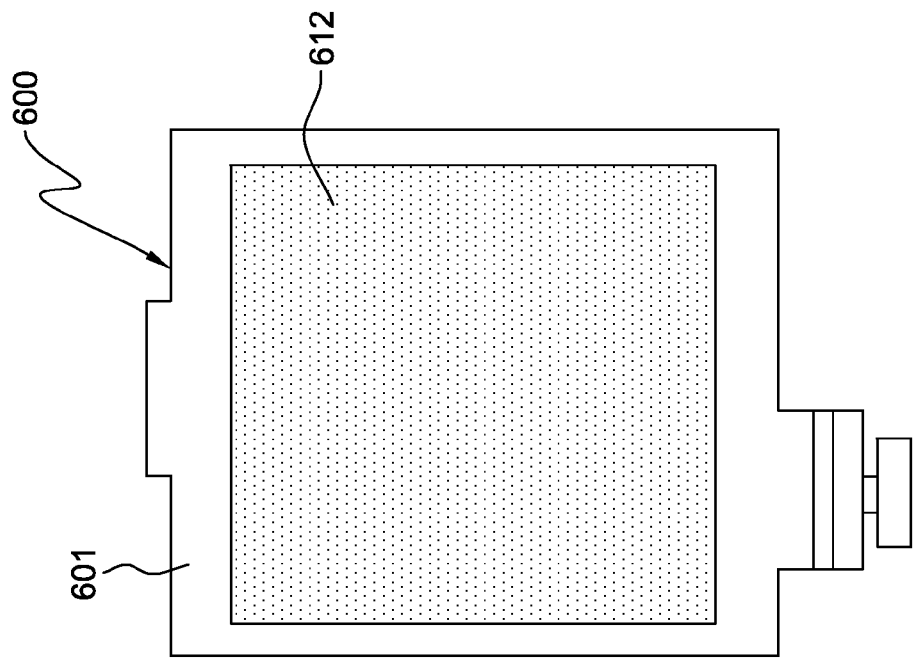
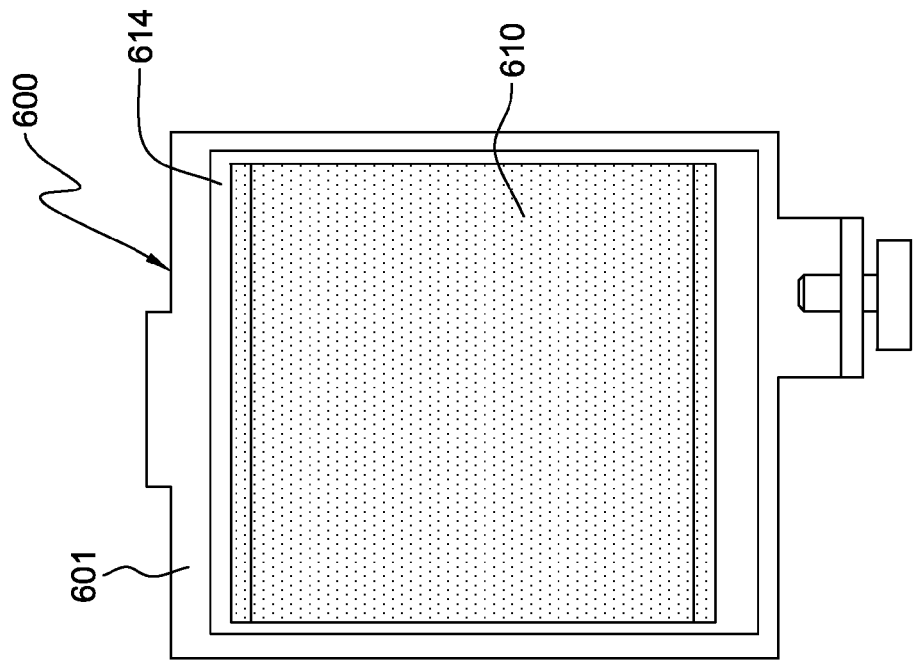
FIG. 6A
FIG. 6B

FERRITE INDUCTORS INTEGRATED WITHIN INPUT/OUTPUT CABLE PORT ASSEMBLY OF AN ELECTRONICS RACK

BACKGROUND

The present invention relates in general to ferrite inductors for suppressing electromagnetic interference (EMI), and more particularly, to ferrite inductors for suppressing EMI emanating from rack-mounted assemblages of individual electronics units within a data center.

A cable that carries analog signals or digital signals, has a tendency to act as an antenna, radiating energy in the form of electromagnetic radiation. This tendency depends on several factors, including the frequency of the signals and the length and the geometric layout of the cable. The electromagnetic radiation emitted by a cable increases the noise level of the electromagnetic environment. That is, it may create electromagnetic interference (EMI). It is known that one or more ferrite cores may be placed on a cable to suppress the effects of EMI. To be effective, the core or cores should allow the magnetic flux produced by current in the cable to flow through the ferrite material. The EMI suppression effect of ferrite cores is reduced if air gaps exist between the cores.

Ferrite cores are generally produced by sintering suitable materials into rigid bodies, which materials are known in the art. Such materials include, for example, MnZn for lower frequencies and NiZn for middle and upper frequencies. The sintered ferrite material is dense and brittle, and can be somewhat bulky. The use of ferrite cores to suppress EMI can therefore be challenging from an electronics packaging perspective, both at the electronics unit level, as well as at the electronics rack level.

In preassembled cable assemblies, ferrite cores are typically retained on a cable at a particular location with a plastic shrink-wrap. Cables may also be retrofit with ferrite cores by mounting the cores in plastic housings that are then clipped or clamped directly to the cable. Both of these ferrite core solutions for reducing EMI require customization of many cables, such as input/output signal cables for an electronics rack. This can result in significant engineering and inventory expenses for a large amount of cable part numbers.

BRIEF SUMMARY

In one aspect, the shortcomings of the prior are overcome and additional advantages are provided through the provision of an input/output cable port assembly for an electronics rack. The input/output cable port assembly includes a cable port structure for the electronics rack with an opening for input/output cables to pass therethrough, and a first partition and a second partition configured to couple to the cable port structure and reside within the opening of the cable port structure. The first partition includes at least one first ferrite inductor portion and the second partition includes at least one second ferrite inductor portion. The first and second partitions are configured to be disposed in operative position as adjoining partitions within the cable port structure, with the at least one first ferrite inductor portion and the at least one second ferrite inductor portion mating and defining a ferrite inductor with a central opening for at least one input/output cable of the electronics rack to pass therethrough, wherein the ferrite inductor attenuates electromagnetic interference resulting from transient or steady state current on the at least one input/output cable passing therethrough.

In another aspect, an electronics system is provided which includes an electronics rack. The electronics rack includes a rack frame, at least one electronics subsystem disposed within the electronics rack and supported by the rack frame, and an input/output cable port assembly within the electronics rack through which at least a portion of the input/output cables of the electronics rack pass. The input/output cable port assembly includes a cable port structure within the electronics rack with an opening for input/output cables to pass therethrough, and a first partition and a second partition. The first and second partition are configured to couple to the cable port structure and reside within the opening of the cable port structure. The first partition includes at least one first ferrite inductor portion and the second partition includes at least one second ferrite inductor portion. The first and second partitions are disposed adjacent each other as adjoining partitions within the cable port structure, with the at least one first ferrite inductor portion and the at least one second ferrite inductor portion mating and defining a ferrite inductor with a central opening for at least one input/output cable of the electronics rack to pass therethrough, wherein the ferrite inductor attenuates electromagnetic interference resulting from transient or steady state current on the at least one input/output cable passing therethrough.

In a further aspect, a method of attenuating electromagnetic interference resulting from transient or steady state currents on input/output cables exiting an electronics rack is provided. The method includes: providing a cable port structure within the electronics rack with an opening for input/output cables to pass therethrough; providing a first partition configured to couple to the cable port structure and reside within the opening of the cable port structure, the first partition comprising at least one first ferrite inductor portion; providing a second partition configured to couple to the cable port structure and reside within the opening of the cable port structure, the second partition comprising at least one second ferrite inductor portion; coupling one partition of the first partition and the second partition in operative position with the cable port structure to reside within the opening; disposing at least one input/output cable along one side of the one partition coupled in operative position with the cable port structure; and coupling the other partition of the first partition and the second partition in operative position with the cable port structure with the at least one input/output cable disposed between the first partition and the second partition, wherein the first partition and the second partition are adjoining partitions coupled to the cable port structure, and the at least one first ferrite inductor portion and the at least one second ferrite inductor portion mate and define a ferrite inductor with a central opening through which the at least one input/output cable of the electronics rack passes, wherein the ferrite inductor attenuates electromagnetic interference resulting from transient or steady state current on the at least one input/output cable passing therethrough.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 6A is an elevational view of an alternate embodiment of a single U-shaped ferrite inductor portion on one side of a partition plate, replacing the multiple U-shaped ferrite inductor portions in the embodiment of FIG. 5B, and attached to the partition plate via an adhesive, in accordance with an aspect of the present invention; and FIG. 6B is an elevational view of an alternate embodiment of the flat ferrite inductor portion attached to the partition plate shown in FIG. 5D, wherein the inductor portion is attached to the partition plate via an adhesive, in accordance with an aspect of the present invention.

DETAILED DESCRIPTION

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. An electronics rack comprises at least one electronics subsystem. "Electronics subsystem" refers to any sub-housing, blade, book, drawer, node, compartment, etc., having one or more heat generating electronic components disposed therein. Each electronics subsystem of an electronics rack may be movable or fixed relative to the electronics rack, with the electronics drawers of a multi-drawer rack unit and blades of a blade center system being two examples of electronics subsystems of an electronics rack to be cooled. "Cable port structure" refers to any frame, bracket, housing, etc., defining an opening through which input/output cables of the electronics rack are to pass. In one embodiment, the cable port structure is disposed at the bottom or at a lower region of the electronics rack, and is particularly useful in a non-raised floor data center installation. In addition, "data center" refers to a computer installation to contain one or more electronics racks to be cooled. As a specific example, a data center may be designed to contain one or more rows of rack-mounted computing units, such as server units.

Reference is made below to the drawings, which are not drawn to scale to facilitate understanding of the invention, wherein the same reference numbers used throughout different figures designate the same or similar components.

Figure 1:
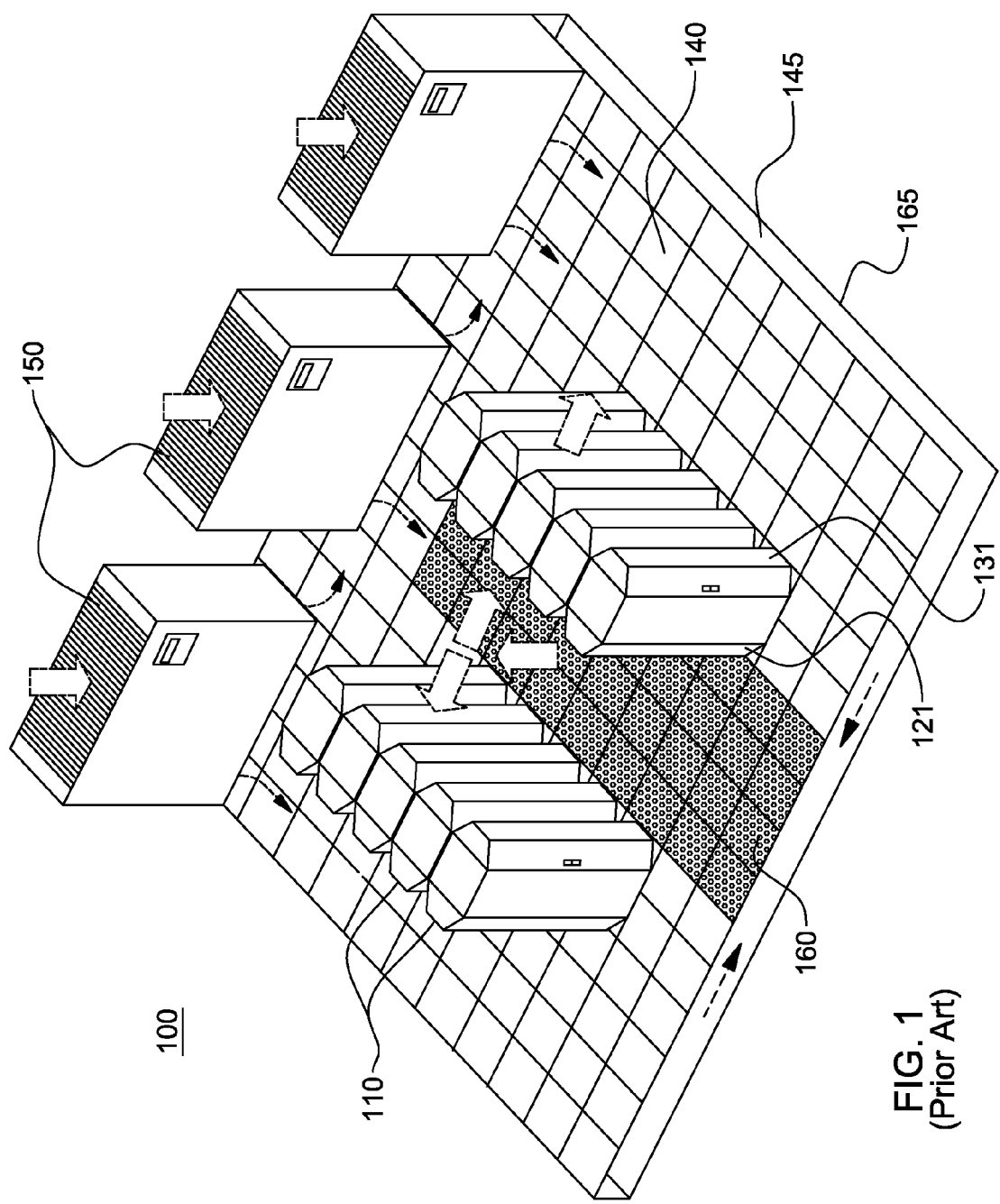
FIG. 1 depicts one embodiment of a conventional raised floor layout of a data center.

As shown in FIG. 1, in a raised floor layout of a computer installation or data center 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered air inlet doors 121 of the electronics racks and expelled through louvered air outlet doors 131 of the electronics racks. Each electronics rack 110 may have an air moving device (e.g., fan or blower) to provide forced inlet-to-outlet air flow to cool the electronic components within the electronics subsystem(s) of the rack. The supply air plenum 145 provides conditioned and cooled air to the air-inlet sides of the electronics racks via perforated floor tiles 160 disposed in a "cold" air aisle of the data center. The conditioned and cooled air is supplied to plenum 145 by one or more conditioned air units 150, also disposed within data center 100. Room air is taken into each conditioned air unit 150 near an upper portion thereof. This room air comprises in part exhausted air from the "hot" air aisles of the data center disposed adjacent to air outlet sides of the electronics racks 110.

Electronics racks comprising high-end computing systems such as a System P® or System Z® offered by International Business Machines Corporation (IBM®), of Armonk, N.Y., comprise configurations for both raised floor and non-raised floor installations. (IBM® System P® and System Z® are registered trademarks of International Business Machines Corporation, Armonk, N.Y. Other names used herein may be registered trademarks, trademarks or product names of International Business Machines Corporation or other companies.)

Figure 2:
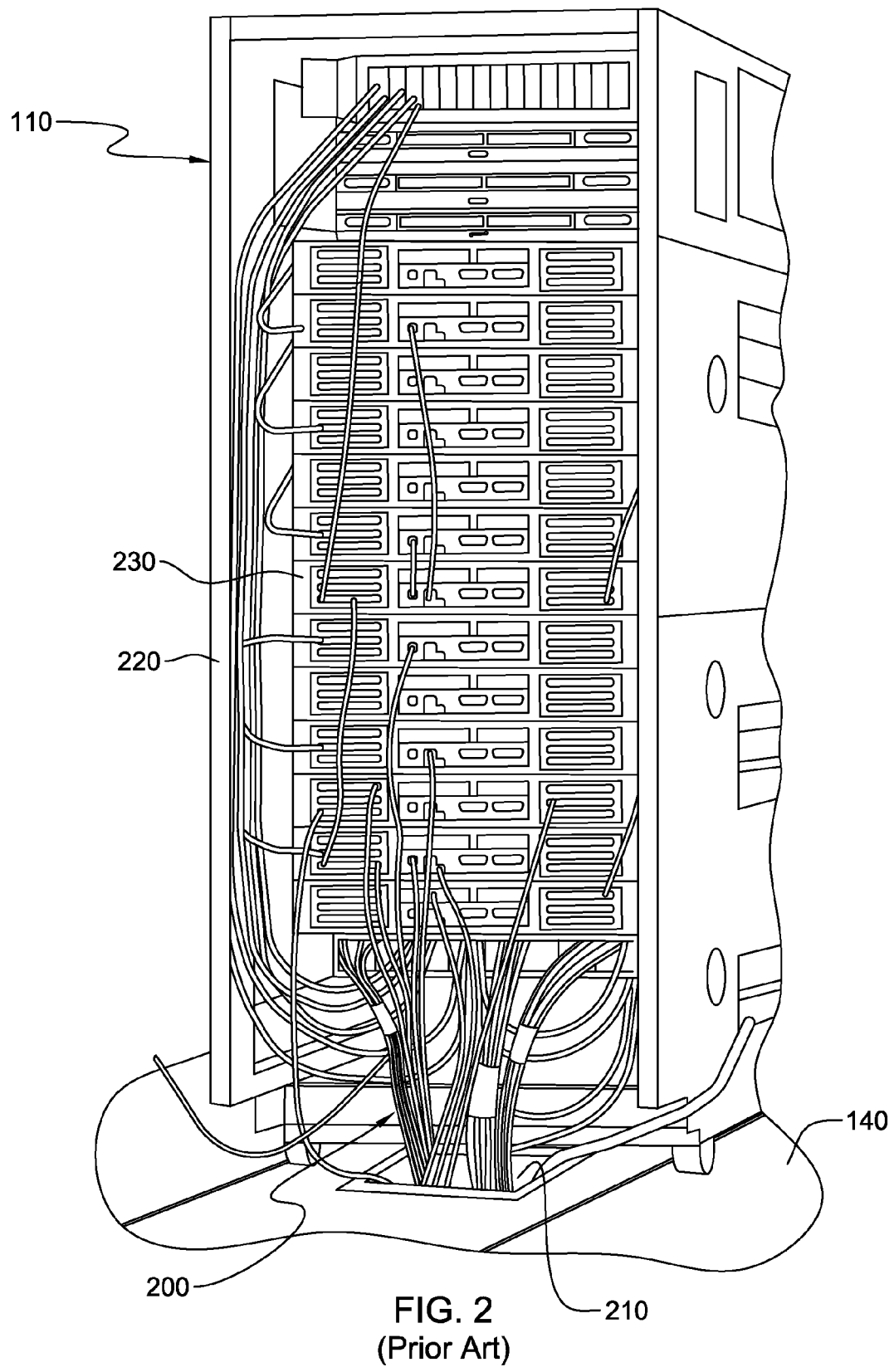
FIG. 2 is a perspective view of one embodiment of a conventional electronics rack disposed on the raised floor of a raised floor data center, and illustrating input/output cables extending into the space below the raised floor.

FIG. 2 illustrates a raised floor 140 installation of an electronics rack 110 wherein a plurality of input/output cables 200, such as various Ethernet cables, extend into an opening 210 in raised floor 140. Electronics rack 110 includes a rack frame 220 which supports a plurality of electronics subsystems 230 from and to which the plurality of cables 200 extend, at least some of which pass through opening 210 in raised floor 140 for coupling, for example, to one or more other electronics racks or electronics equipment within the data center. In one conventional approach, input/output cabling 200 continues under raised floor 140 through a rectangular structure with a conductive gasket that shorts out the structure and forms a capacitive coupling with the metal of the raised floor so that energy is blocked from escaping. However, in a non-raised floor environment, an alternate approach is needed for attenuating electromagnetic interference radiating from the input/output cables.

Figure 3:
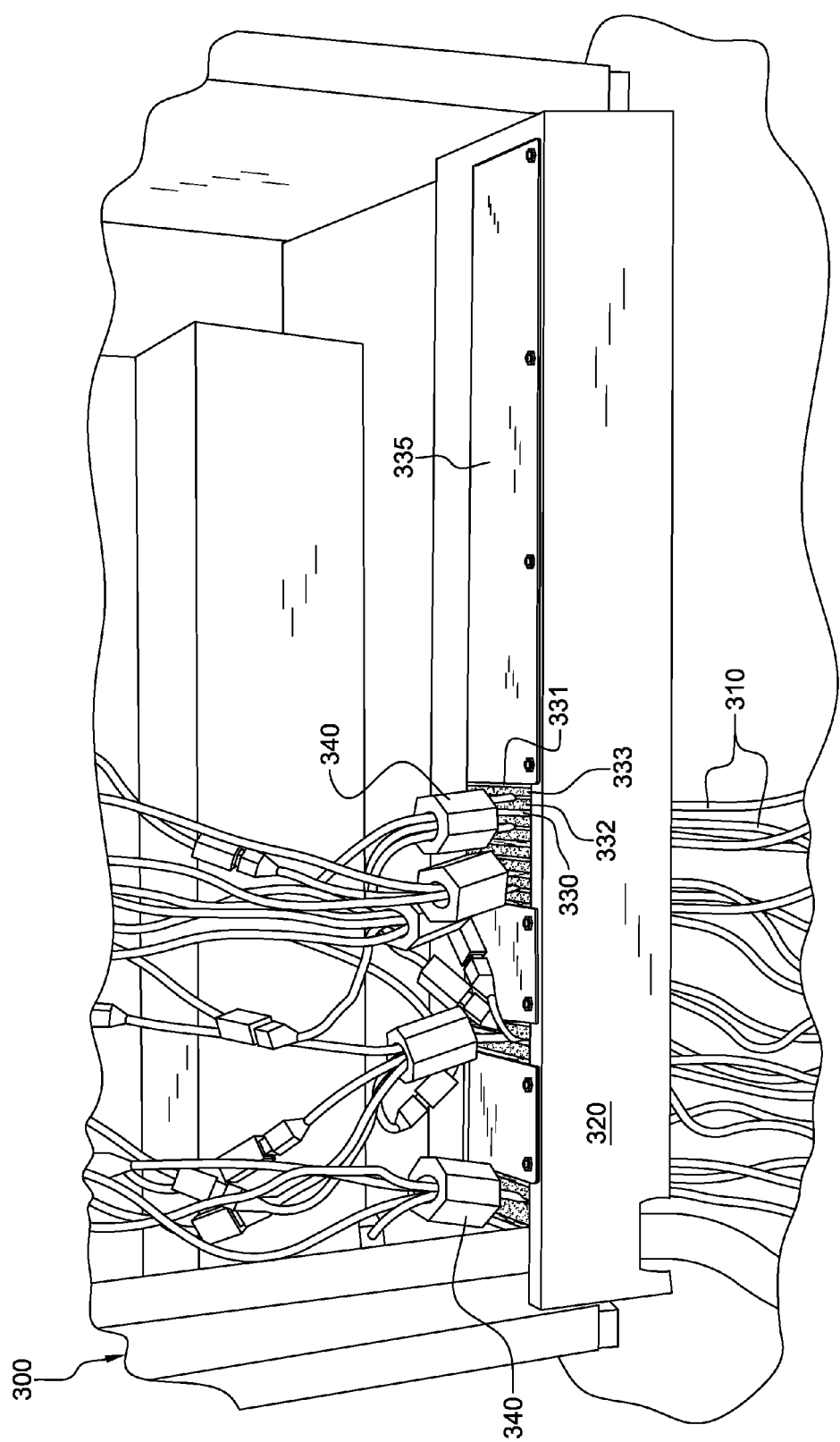
FIG. 3 is a partial perspective view of an alternate embodiment of an electronics rack with a tailgate structure through which input/output cables pass, for facilitating use of the electronics rack in a non-raised floor data center.

FIG. 3 illustrates one embodiment of a lower portion of an electronics rack 300, with an access panel removed and showing a plurality of cables 310 extending through a tailgate structure 320, wherein a plurality of adjoining, interlocked partitions 330, 331 are employed with opposing compressible surfaces 332, 333 which engage one or more input/output cables 310 passing therethrough to provide relief. As illustrated, horizontally-coupled plates 335 can be used to further reduce the size of the cable opening within tailgate structure 320 to limit radiation of electromagnetic interference from the inside of the electronics rack into the data center.

Due to the large amount of input/output cables, which are typically copper-based cables, the non-raised floor installation of electronics rack with exposed input/output cables has more difficulty meeting national and international radiated electromagnetic interference emission limits.

In the illustrated embodiment of FIG. 3, ferrite cores or radio frequency (RF) chokes 340 are shown applied to the input/output cables in the interior of the electronics rack adjacent to tailgate structure 320 to reduce radiated electromagnetic interference emissions. These ferrite cores 340 are disposed before the input/output cables exit the electronics rack and may be in addition to other ferrite cores or RF chokes within the electronics rack used to reduce radiated EMI emissions at different locations within the rack. Note that application of ferrite cores 340 to the input/output cables before leaving through the tailgate structure requires the relative core location to be different for each length of input/output cable. Further, the cables may be differently rated cables, such as differently rated Ethernet cables, each with a length dependent on where the cable is to extend. The ferrite cores 340 are considered loose ferrite cores since they require installation at the customer site. In an alternate implementation, the ferrite cores could be permanently integrated with the cables via plastic molding, or some other permanent means. However, this would result in significant engineering and inventory expenses resulting from the need to produce and/or maintain a large number of cable parts.

For example, in order to satisfy all national and international standards, including the Taiwan Bureau of Standards and Meteorology Inspection (BSMI), many part numbers of the same input/output cable would be required since each one would have a ferrite core installed at a different length from the end-adapter coupled within the electronics rack. In other words, each input/output cable would need to be customized. Disclosed herein is an alternative approach which incorporates a ferrite inductor design into an input/output cable port assembly.

Described below are partitions for an input/output cable port assembly of an electronics rack between which at least a portion of the input/output cables of the electronics rack pass. The input/output cable port assembly includes a cable port structure for the electronics rack with an opening through which input/output cables pass, and configured to accommodate multiple partitions, which facilitate, in part, breaking up of the relatively large cable port opening to control electromagnetic interference emissions from the rack unit. In one implementation, the input/output cable port assembly disclosed herein is disposed at or near the bottom of the electronics rack frame, for example, at one or both of the air inlet side and air outlet side of the electronics rack. At least two adjoining partitions of the input/output cable port assembly are fitted with one or more first ferrite inductor portions and/or one or more second ferrite inductor portions, which when the partitions are disposed adjacent to each other as adjoining partitions within the cable port structure, allow the first ferrite inductor portions and second ferrite inductor portions to mate and define a ferrite inductor with a central opening sized to allow one or more input/output cables of the electronics rack to pass therethrough. The ferrite inductor is configured to attenuate electromagnetic interference resulting from transient or steady state current on the one or more cables passing through the central opening of the ferrite inductor defined by the adjoining partitions of the input/output cable port assembly.

The adjoining partitions may be identical partitions, with the different ferrite inductor portions disposed on opposite sides of a partition plate, and may exclusively be employed within the input/output cable port assembly, or may be employed in combination with the relief partitions depicted in FIG. 3, which are configured and sized to compressibly hold input/output cables passing therethrough. By way of example, upper opposing portions of adjoining partitions may have ferrite inductor portions such as described herein disposed in opposing relation to encircle the input/output cables passing therethrough, while lower opposing portions of the same adjoining partitions may have a rubber or other compressible material spaced to compressibly engage the input/output cables passing therebetween and thereby hold the cables fixed. Advantageously, by providing ferrite inductor portions configured to mate and encircle one or more input/output cables, the need to customize input/output cables with ferrite cores or RF chokes is eliminated. In addition, multiple ferrite inductors with different ranges of suppression frequencies can be implemented by adjoining partitions as described herein below, thus yielding improved efficiency and flexibility in suppressing transient or steady state current on input/output cables passing through the ferrite inductor(s).

Referring collectively to FIGS. 4, 5A-5C, one embodiment of an input/output cable port assembly 420 is depicted for an electronics rack 400 through which at least a portion of the input/output cables 410 of the electronics rack pass. The input/output cables 410 are coupled via connectors 401 to internal rack cables (by way of example only) in FIG. 4.

Figure 4:
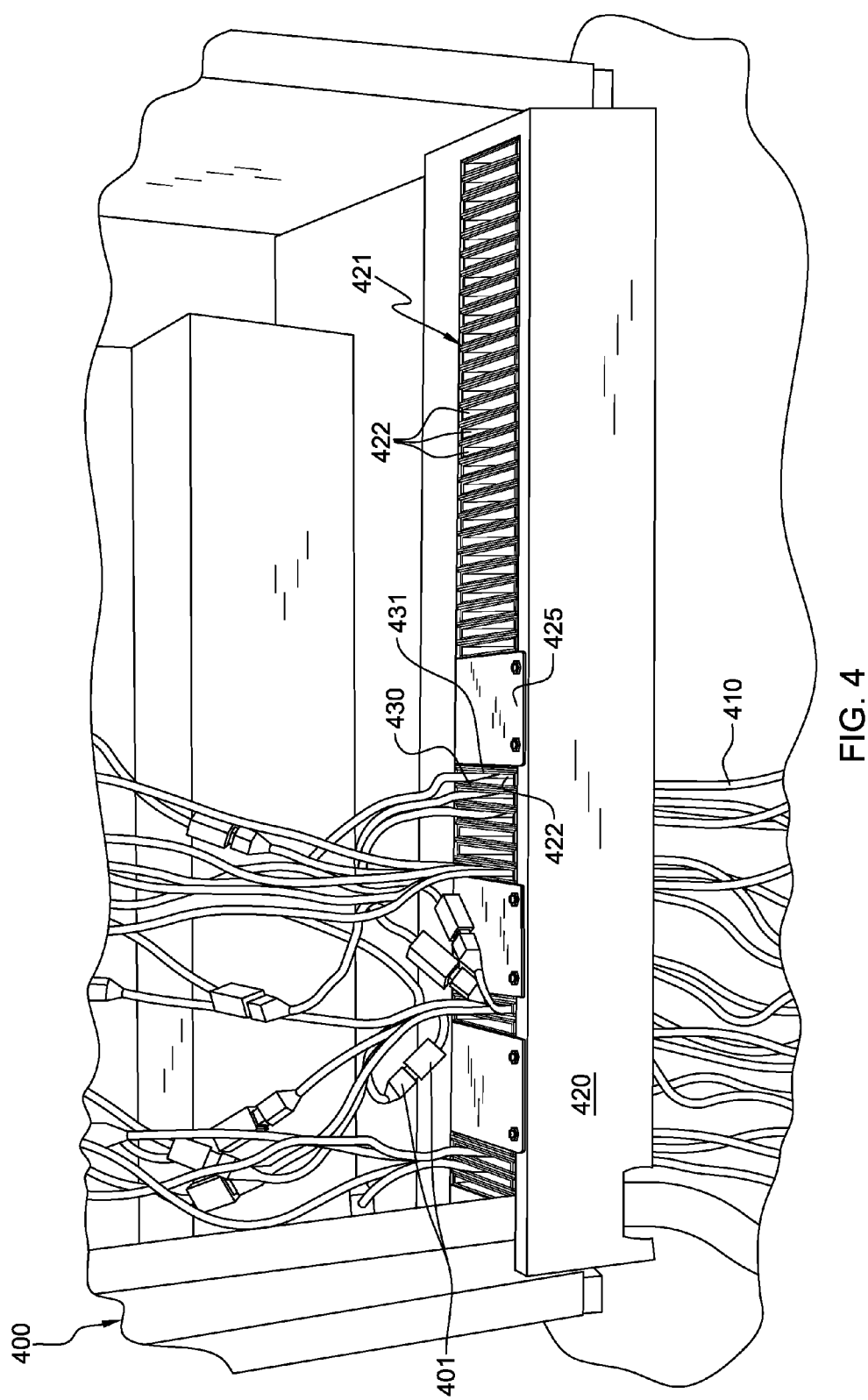
FIG. 4 is a partial perspective view of another embodiment of an electronics rack with an input/output cable port assembly through which at least a portion of the input/output cables of the electronics rack pass, in accordance with an aspect of the present invention.

The input/output cable port assembly 420 is shown to include a cable port structure 421 disposed within the electronics rack and having an opening 422 through which input/output cables 410 pass. As noted, the cable port structure can be disposed on one side of the electronics rack, or multiple sides of the electronics rack, as needed by a particular electronics system implementation. In the illustrated example of FIG. 4, two adjoining partitions 430, 431 are referenced of the multiple illustrated partitions which function to reduce the cable port opening 422 into smaller openings, and allow for the passage of the input/output cables from the electronics rack. Note also with respect to FIG. 4, that the leftmost and rightmost partitions in the cable port structure need only comprise ferrite inductor portions on one side to complete a ferrite inductor through which input/output cables may pass. In FIG. 4, mating pairs of partitions, referred herein to as adjoining partitions, are illustrated, with the partitions being employed in defining the adjacent sets of adjoining partitions.

Figure 5B:
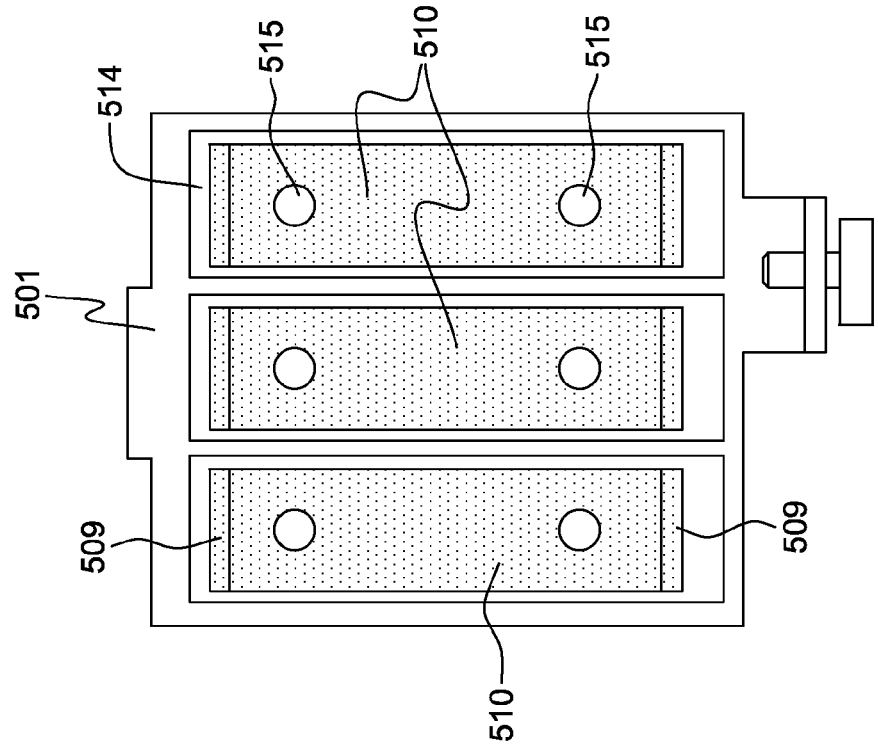
FIG. 5B is an elevational view of one embodiment of U-shaped ferrite inductor portions on one side of one partition plate shown in FIG. 5A, in accordance with an aspect of the present invention.
Figure 5A:
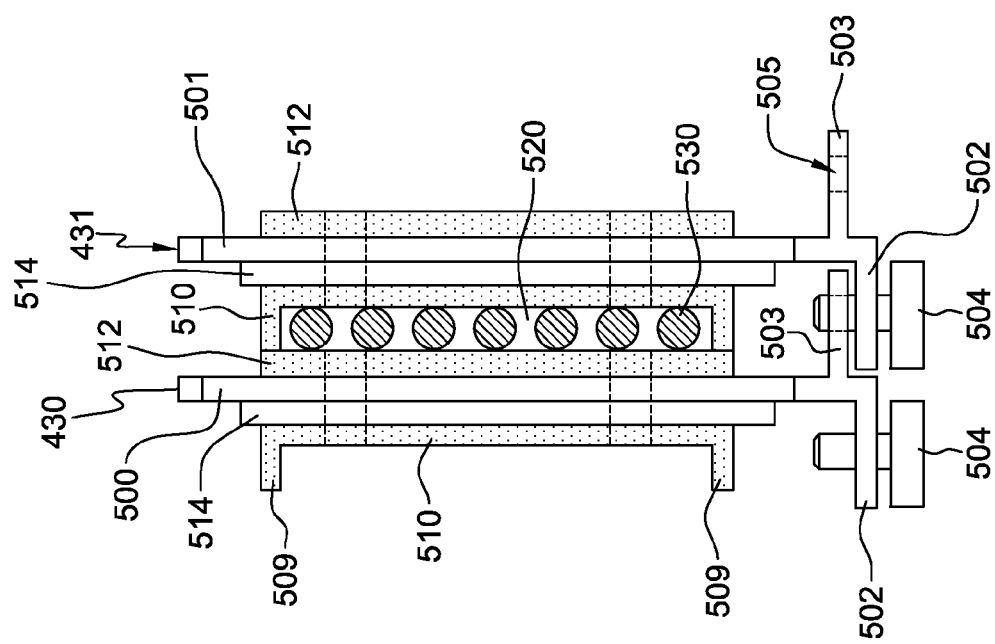
FIG. 5A is a plan view of one embodiment of two adjoining partitions of the input/output cable port assembly of FIG. 4, wherein the two adjoining partitions are shown interlocked, and illustrating a plurality of input/output cables passing through the ferrite inductor defined between the adjoining partitions, in accordance with an aspect of the present invention.

Referring to the plan view of FIG. 5A, each partition 430, 431 of the two adjoining partitions (referenced in FIG. 4) is shown to comprise a partition plate 500, 501, which may comprise, in one embodiment, a metal partition plate. Partition plates 500, 501 may be used with other (e.g., horizontal) plates 425 (see FIG. 4) to break up the relatively large cable port opening into smaller openings, which allow the input/output cables to exit, while minimizing EMI emissions from the electronics rack. Each partition plate 500, 501 is shown to include flanges 502, 503, with flange 502 accommodating a spring-biased pin 504 and flange 503 comprising an opening 505 configured to receive spring-biased pin 504 of an adjoining partition such that the adjoining partitions interlock (as illustrated in FIG. 5A) with the compressible pin 504 of partition 431 shown engaging opening 505 in partition 430.

In addition to partition plate 500, 501, each partition 430, 431 includes one or more U-shaped ferrite inductor portions 510 on a first side thereof and one or more flat ferrite inductor portions 512 on a second side thereof. Compressible elastomer layers 514 are disposed in the example of FIG. 5A between the one or more U-shaped ferrite inductor portions 510 and the respective partition plates 500, 501 of partitions 430, 431. The compressible elastomer layers, which could alternatively, or even additionally, be disposed between the flat ferrite inductor portions 512 and the respective partition plates 500, 501, are a compressible resilient elastomer, which is provided to take up any mechanical slot tolerance between the adjoining partitions (coupled to the cable port structure) by applying pressure to one or both of the opposing ferrite inductor portions of the partitions to complete the ferrite inductor without any gap between the opposing portions. The resultant ferrite inductor is illustrated in the plan view of FIG. 5A as having, in one embodiment, a rectangular-shaped central opening 520. Depending on the configuration of the ferrite inductor portions, however, other central opening configurations could be provided. In the illustrated example, a plurality of input/output cables 530 are shown extending through central opening 520 in the ferrite inductor defined between adjoining partitions 430, 431.

FIG. 5B is an elevational view of the one side of partition 431 in opposing relation with partition 430 in FIG. 4. In FIG. 5B, three U-shaped ferrite inductor portions 510 are illustrated, each coupled via respective mechanical fasteners 515 (e.g., nylon fasteners) across compressible elastomer layers 514 to the partition plate 501. In the illustrated embodiment, the use of multiple U-shaped ferrite inductor portions 510 advantageously allows for different ferrite inductor portions of the partition to have different ranges of suppression frequencies by tailoring the respective compositions of the ferrite inductor portions. That is, the three pairs of opposing ferrite inductor portions 510, 512 illustrated in FIGS. 5B & 5C may each comprise different ferrite permanability materials to respectively suppress low, middle and high frequencies.

Figure 5C:
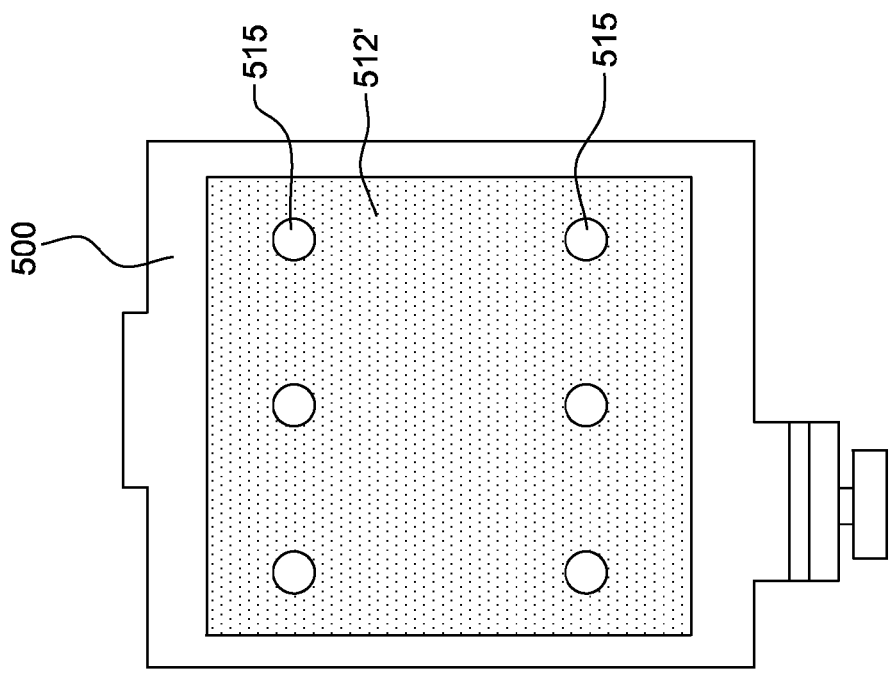
FIG. 5C is an elevational view of one embodiment of flat ferrite inductor portions on one side of the other partition plate shown in FIG. 5A, illustrating flat ferrite inductor portions sized and configured to align to respective U-shaped ferrite inductor portions of the adjoining partition, in accordance with an aspect of the present invention.

As illustrated in FIG. 5C, corresponding flat (e.g., I-shaped) ferrite inductor portions may be provided on the opposing side of the partition plate 500 of partition 430 of the adjoining partitions 430, 431 shown in FIG. 4. In one embodiment, each partition is identical, which allows for a sequence of more than two adjoining partitions to be operatively positioned and interlocked within the input/output cable port assembly, as needed. In this manner, a large number of input/output cables can be accommodated within the illustrated input/output cable port assembly of FIG. 4. Note that the projecting arms 509 of the U-shaped ferrite inductor portions 510 illustrated in FIGS. 5A & 5B are sized to allow for input/output cables 530 to extend through the central opening 520 of the ferrite inductor resulting from the mating of the U-shaped ferrite inductor portions 510 and flat ferrite inductor portions 512 on the adjoining, opposing sides of the partitions. If desired, these projecting arms 509 could be sized so that when two adjoining partitions are interlocked in operative position (as illustrated in FIG. 5A), the cables frictionally are engaged by the opposing ferrite inductor portions. This frictional engagement would limit the need for any further engagement of the input/output cables to hold the cables in fixed position relative to the electronics rack.

Figure 5D:
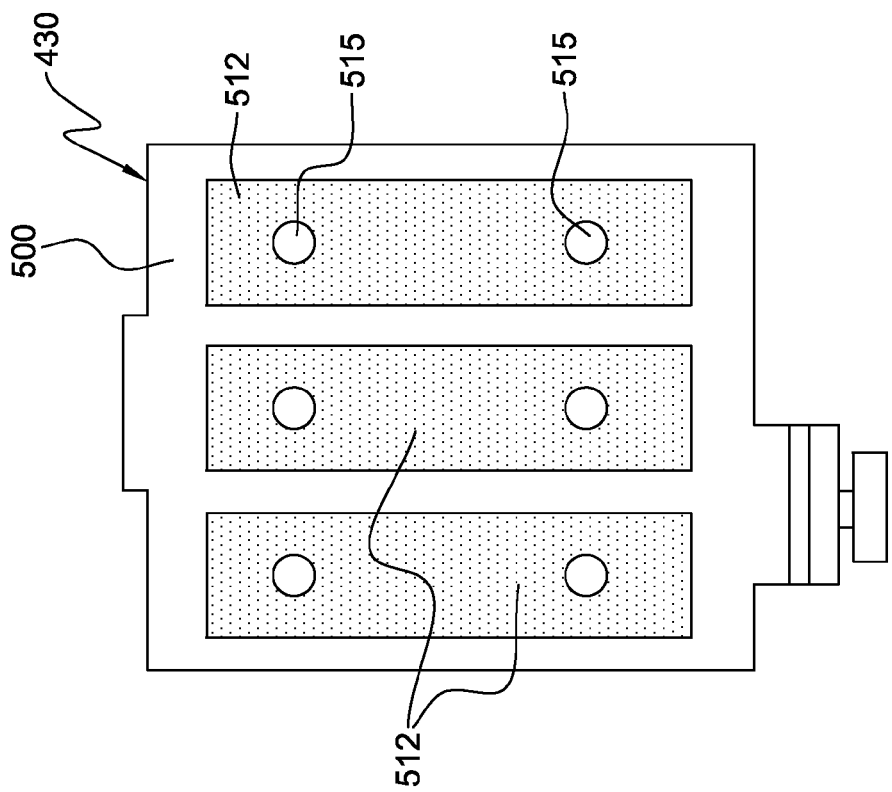
FIG. 5D is an elevational view of alternate embodiment of a single flat ferrite inductor portion, which may replace the multiple flat ferrite inductor portions of FIG. 5C, in accordance with an aspect of the present invention.

FIG. 5D depicts an alternate embodiment of one side of a partition wherein a single flat ferrite inductor portion 515' is attached to the partition plate 500 via mechanical fasteners 515. In one embodiment, the mechanical fasteners may be recessed within the ferrite inductor portions on opposite sides of the partition so as not to extend beyond the ferrite inductor portions, and thereby otherwise limit placement of input/output cables within the central opening(s) defined between two adjoining, interlocked partitions of the input/output cable port assembly.

FIGS. 6A & 6B depict a further alternate implementation of a partition 600, in accordance with an aspect of the present invention. In this implementation, partition 600 comprises a first side, shown in FIG. 6A, wherein a single U-shaped ferrite inductor portion 610 is illustrated as being mounted to a partition plate 601 across a compressible elastomeric material 614, and in FIG. 6B, a single flat ferrite inductor portion 612 is shown on the opposite side of partition 600 mounted to partition plate 601. In these figures, no mechanical fasteners are illustrated, rather an adhesive material is employed between the respective components of the partition.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An input/output cable port assembly for an electronics rack comprising:
   a cable port structure defined in the electronics rack with an opening for input/output cables to pass therethrough;
   a first partition configured to couple to the cable port structure and reside within the opening of the cable port structure, the first partition comprising at least one first ferrite inductor portion;
   a second partition configured to couple to the cable port structure and reside within the opening of the cable port, structure, the second partition comprising at least one second ferrite inductor portion;
   wherein the first partition and the second partition are configured to be disposed adjacent to each other as adjoining partitions within the opening in the cable port structure, and when disposed as adjoining partitions within the cable port structure, the at least one first ferrite inductor portion and the at least one second ferrite inductor portion mate and define a ferrite inductor with a central opening for at least one input/output cable of the electronics rack to pass therethrough, wherein the ferrite inductor attenuates electromagnetic interference resulting from transient or steady state current on the at least one input/output cable passing therethrough; and
   wherein at least one of the first partition or second partition comprises a compressible elastomer layer, and wherein with the first partition and the second partition disposed as adjoining partitions within the cable port structure, the at least one first ferrite inductor portion, the at least one second ferrite inductor portion and the compressible elastomer layer are sized and disposed so that the compressible elastomer layer applies force to at least one of the at least one first ferrite inductor portion or the at least one second ferrite inductor portion to ensure that the at least one first ferrite inductor portion and the at least one second ferrite inductor portion physically contact without an air gap therebetween and define the ferrite inductor with the central opening through which the at least one input/output cable passes.

2. The input/output cable port assembly of claim 1, wherein the first partition and the second partition are configured to interlock when disposed as adjoining partitions within the cable port structure.

3. The input/output cable port assembly of claim 1, wherein the at least one first ferrite inductor portion comprises at least one U-shaped ferrite inductor portion at least partially extending from the first partition, and the at least one second ferrite inductor portion comprises at least one flat ferrite inductor portion.

4. The input/output cable port assembly of claim 3, wherein the first partition comprises multiple U-shaped ferrite inductor portions, and wherein at least two U-shaped ferrite inductor portions of the multiple U-shaped ferrite inductor portions attenuate electromagnetic interference of different frequency ranges.

5. The input/output cable port assembly of claim 4, wherein the second partition comprises multiple flat ferrite inductor portions, each flat ferrite inductor portion being, configured and sized to mate with projecting arms of a respective U-shaped ferrite inductor portion of the multiple U-shaped ferrite inductor portions of the first partition with the first partition and the second partition disposed as adjoining partitions within the cable port structure.

6. The input/output cable port assembly of claim 1, wherein the first partition comprises a partition plate within at least one first ferrite inductor portion disposed on a first side of the partition plate and at least one second ferrite inductor portion disposed on a second side of the partition plate, and wherein the second partition comprises a partition plate within at least one first ferrite inductor portion disposed on a first side thereof and at least one second ferrite inductor portion disposed on a second side thereof, wherein with the first partition and the second partition disposed as adjoining partitions within the cable port structure, the at least one first ferrite inductor portion on the first side of the partition plate of the first partition is in opposing relation to and physically contacting the at least one second ferrite inductor portion on the second side of the partition plate of the second partition.

7. The input/output cable port assembly of claim 6, further comprising a compressible elastomer layer disposed between at least one of the partition plate of the first partition and the at least one first ferrite inductor portion on the first side of the partition plate of the first partition, or between the partition plate of the second partition and the at least one second ferrite inductor portion on the second side of the partition plate of the second partition, wherein the at least one first ferrite inductor portion on the first side of the partition plate of the first partition, the at least one second ferrite inductor portion on the second side of the partition plate of the second partition, and the compressible elastomer layer are sized and disposed so that the compressible elastomer layer applies a force to the at least one first ferrite inductor portion or the at least one second ferrite inductor portion to ensure that the at least one first ferrite inductor portion and the at least one second ferrite inductor portion are in physical contact without an air gap therebetween.

8. The input/output cable port assembly of claim 1, wherein the cable port structure is a tailgate structure disposed at a bottom of the electronics rack, the tailgate structure being configured to facilitate installation of the electronics rack in a non-raised floor data center.

9. An electronics system comprising:
   an electronics rack, the electronics rack comprising:
      a rack frame;
      at least one electronics subsystem disposed within the electronics rack and supported by the rack frame; and
      an input/output cable port assembly within the electronics rack through which at least a portion of the input/output cables of the electronics rack pass, the input/output cable port assembly comprising:
         a cable port structure within the electronics rack with an opening for input/output cables to pass therethrough;
         a first partition coupled to the cable port structure and residing within the opening of the cable port structure, the first partition comprising at least one first ferrite inductor portion;
         a second partition coupled to the cable port structure and residing within the opening of the cable port structure, the second partition comprising at least one second ferrite inductor portion; and
         wherein the first partition and the second partition are disposed adjacent to each other as adjoining partitions within the cable port structure, with the at least one first ferrite inductor portion and the at least one second ferrite inductor portion mating and defining a ferrite inductor with a central opening accommodating at least one input/output cable of the electronics rack passing therethrough, wherein the ferrite inductor attenuates electromagnetic interference resulting from transient or steady state current on the at least one input/output cable passing therethrough.

10. The electronics system of claim 9, wherein the first partition and the second partition comprise an interlocking mechanism and are interlocked as adjoining partitions within the cable port structure.

11. The electronics system of claim 9, wherein the at least one first ferrite inductor portion comprises at least one U-shaped ferrite inductor portion at least partially extending from the first partition, and the at least one second ferrite inductor portion comprises at least one flat ferrite inductor portion in opposing relation with the at least one U-shaped ferrite inductor portion.

12. The electronics system of claim 11, wherein the first partition comprises multiple U-shaped ferrite inductor portions, wherein at least two U-shaped ferrite inductor portions of the multiple U-shaped ferrite inductor portions attenuate electromagnetic interference of different frequency ranges.

13. The electronics system of claim 12, wherein the second partition comprises multiple flat ferrite inductor portions, each flat ferrite inductor portion being configured and sized to mate with projecting arms of a respective U-shaped ferrite inductor portion of the multiple U-shaped ferrite inductor portions of the first partition.

14. The electronics system of claim 9, wherein the first partition and the second partition are identical partitions, each identical partition comprising at least one first ferrite inductor portion disposed on a first side thereof and at least one second ferrite inductor portion disposed on a second side thereof, and wherein the first partition and the second partition are disposed as adjoining partitions within the cable port structure with the at least one first ferrite inductor portion of the first partition in opposing relation to and physically contacting the at least one second ferrite inductor portion of the second partition.

15. The electronics system of claim 14, further comprising a compressible elastomer material disposed between at least one of a partition plate of the first partition and the at least one first ferrite inductor portion of the first partition, or between a partition plate of the second partition and the at least one second ferrite inductor portion of the section partition, the compressible elastomer layer applying a force to ensure that the at least one first ferrite inductor portion and the at least one second ferrite inductor portion are in physical contact without an air gap therebetween.

16. The electronics system of claim 9, wherein the cable port structure is a tailgate structure disposed at a bottom of the electronics rack, the tailgate structure being configured to facilitate installation of the electronics rack in a non-raised floor data center.

17. A method of attenuating electromagnetic interference resulting from transient or steady state currents on input/output cables to exit an electronics rack, the method comprising:
providing a cable port structure within the electronics rack with an opening for input/output cables to pass therethrough;
providing a first partition configured to couple to the cable port structure and reside within the opening in the cable port structure, the first partition comprising at least one first ferrite inductor portion;
providing a second partition configured to couple to the cable port structure and reside within the opening of the cable port structure, the second partition comprising at least one second ferrite inductor portion;
coupling one partition of the first partition and the second partition in operative position within the cable port structure to reside within the opening;
disposing at least one input/output cable along one side of the one partition coupled in operative position within the cable port structure;
coupling the other partition of the first partition and the second partition in operative position within the cable port structure with the at least one input/output cable disposed between the first partition and the second partition, wherein the first partition and the second partition are adjoining partitions coupled to the cable port structure, and the at least one first ferrite inductor portion and the at least one second ferrite inductor portion mate and define a ferrite inductor with a central opening through which the at least one input/output cable of the electronics rack passes, wherein the ferrite inductor attenuates electromagnetic interference resulting from transient or steady state current on the at least one input/output cable passing therethrough; and
wherein at least one of the first partition or second partition comprises a compressible elastomer layer, and wherein with the first partition and the second partition disposed as adjoining partitions within the cable port structure, the at least one first ferrite inductor portion, the at least one second ferrite inductor portion and the compressible elastomer layer are sized and disposed so that the compressible elastomer layer applies force to at least one of the at least one first ferrite inductor portion or the at least one second ferrite inductor portion to ensure that the at least one first ferrite inductor portion and the at least one second ferrite inductor portion physically contact without an air gap therebetween and define the ferrite inductor with the central opening through which the at least one input/output cable passes.

18. The method of claim 17, wherein coupling the other partition of the first partition and the second partition in operative position with the cable port structure further comprises interlocking the other partition to the one partition in operative position within the cable port structure, and wherein the at least one first ferrite inductor portion comprises at least one U-shaped ferrite inductor portion at least partially extending, from the first partition, and the at least one second ferrite inductor portion comprises at least one flat ferrite inductor portion.

19. The method of claim 18, wherein the first partition comprises multiple U-shaped ferrite inductor portions, and wherein at least two U-shaped ferrite inductor portions of the multiple U-shaped ferrite inductor portions attenuate electromagnetic interference of different frequency ranges, and wherein the at least one input/output cable passes through the central opening defined by the multiple U-shaped ferrite inductor portions in opposing relation to the at least one flat ferrite inductor portion.

* * * * *